United States Patent
Sudo

(10) Patent No.: US 9,612,753 B2
(45) Date of Patent: Apr. 4, 2017

(54) SEMICONDUCTOR MEMORY APPARATUS AND DATA PROCESSING METHOD

(71) Applicant: Winbond Electronics Corp., Taichung (TW)

(72) Inventor: Naoaki Sudo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 31 days.

(21) Appl. No.: 14/923,452

(22) Filed: Oct. 27, 2015

(65) Prior Publication Data

US 2016/0283113 A1 Sep. 29, 2016

(30) Foreign Application Priority Data

Mar. 26, 2015 (JP) .................... 2015-064388

(51) Int. Cl.
| | |
|---|---|
| *G06F 3/06* | (2006.01) |
| *G11C 16/10* | (2006.01) |
| *G11C 7/10* | (2006.01) |
| *G11C 16/04* | (2006.01) |
| *G11C 16/26* | (2006.01) |
| *G11C 16/34* | (2006.01) |

(52) U.S. Cl.
CPC ............ *G06F 3/061* (2013.01); *G06F 3/0638* (2013.01); *G06F 3/0679* (2013.01); *G11C 7/1006* (2013.01); *G11C 16/0483* (2013.01); *G11C 16/10* (2013.01); *G11C 16/26* (2013.01); *G11C 16/3427* (2013.01)

(58) Field of Classification Search
CPC ...... G06F 3/061; G06F 3/0638; G06F 3/0679; G11C 16/10; G11C 16/0483; G11C 16/26; G11C 16/3427; G11C 7/1006
See application file for complete search history.

(56) References Cited

U.S. PATENT DOCUMENTS

| | | | | |
|---|---|---|---|---|
| 5,787,179 | A * | 7/1998 | Ogawa ................ | H04N 7/1675 348/E7.056 |
| 7,603,413 | B1 * | 10/2009 | Herold ................. | G06Q 10/10 455/466 |
| 8,127,200 | B2 | 2/2012 | Sharon et al. | |
| 2008/0158948 | A1 | 7/2008 | Sharon et al. | |

FOREIGN PATENT DOCUMENTS

| | | |
|---|---|---|
| JP | 2008-198299 | 8/2008 |
| KR | 10-1082650 | 11/2011 |
| KR | 10-2014-0023609 | 2/2014 |

* cited by examiner

*Primary Examiner* — Hiep Nguyen
(74) *Attorney, Agent, or Firm* — Jianq Chyun IP Office

(57) ABSTRACT

A semiconductor memory apparatus is provided. The semiconductor memory apparatus does not require additional identification information to perform data scrambling and improves the reliability, where the identification information is used to identify whether it is an erased data or a programmed data. A flash memory of the present disclosure includes a scrambling unit 120 scrambling data between an input/output buffer 110 and a page buffer 160. The scrambling unit 120 includes a writing encoder 200 and a reading decoder 220. When an input data is equal to a predetermined bit string, the writing encoder 200 skips the scrambling of the input data. When a read data of the page buffer 160 is equal to the predetermined bit string, the reading decoder 220 skips the descrambling of the read data.

10 Claims, 5 Drawing Sheets

| Input data | Scrambling | Programming cell |
|---|---|---|
| FFh | – | FFh |
| XXh | FFh | XXh |
| YYh | ZZh | ZZh |

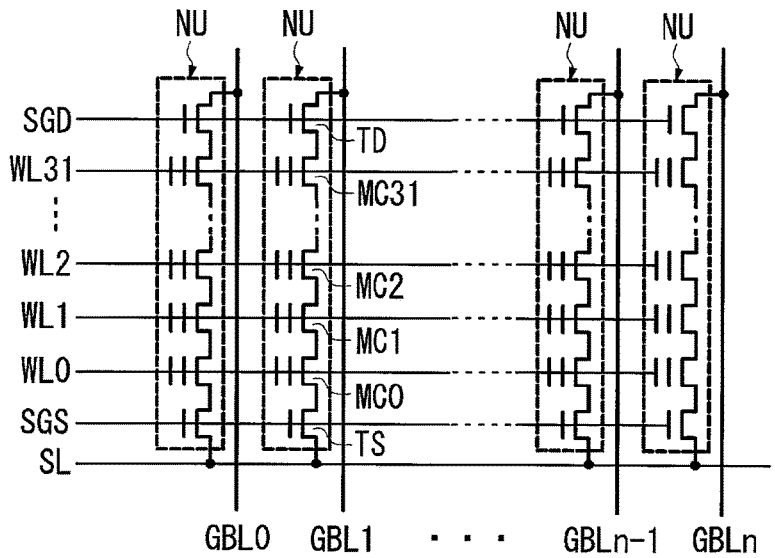
FIG. 3
| | erase | write | read |
|---|---|---|---|
| Selected W/L | 0 | 15~20V | 0 |
| Non-selected W/L | F | 10V | 4.5 |
| SGD | F | Vcc | 4.5 |
| SGS | F | 0 | 4.5 |
| SL | F | Vcc | 0 |
| P well | 21 | 0 | 0 |
FIG. 4
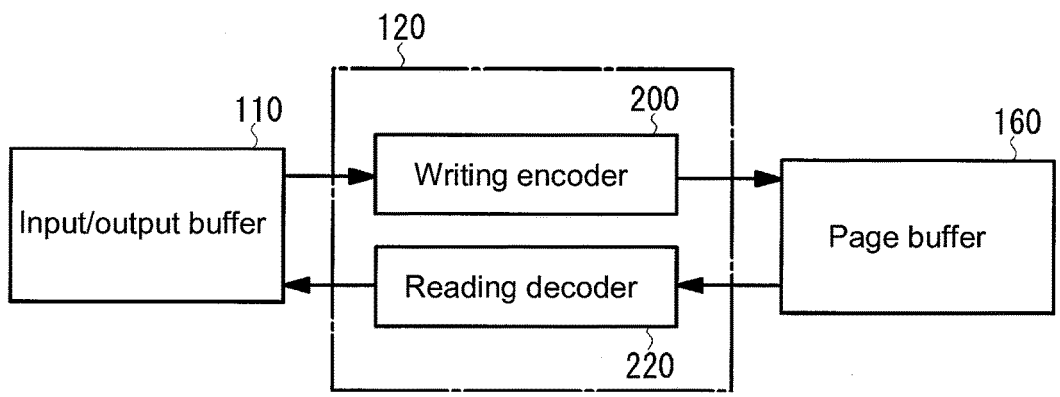
FIG. 5

| Input data | Scrambling | Programming cell |
|---|---|---|
| FFh | – | FFh |
| XXh | FFh | XXh |
| YYh | ZZh | ZZh |

FIG. 6A

| Programming cell | Descrambling | Output data |
|---|---|---|
| FFh | – | FFh |
| XXh | FFh | XXh |
| ZZh | YYh | YYh |

FIG. 6B

SEMICONDUCTOR MEMORY APPARATUS AND DATA PROCESSING METHOD

CROSS-REFERENCE TO RELATED APPLICATION

This application claims the priority benefit of Japanese application serial no. 2015-064388, filed on Mar. 26, 2015. The entirety of the above-mentioned patent application is hereby incorporated by reference herein and made a part of this specification.

TECHNICAL FIELD

The disclosure is related to a semiconductor memory apparatus having NAND type flash memory and data processing method thereof, and particularly to a descrambling method of data in the NAND type flash memory.

BACKGROUND

NAND type flash storage device includes memory arrays of a plurality of blocks. In one of the blocks, a plurality of memory cells are serially connected together to form a NAND string. Typically, data reading or data programming is performed by using page as a unit, and data erasing is performed by using block as a unit.

Patent reference 1 disclosed a data writing method to reliably enhance operations of the NAND type flash memory. The data writing method includes selecting a scramble pattern based on an address of a word line, scrambling write data based on the selected scramble pattern, and writing the scrambled data to a corresponding page.

PRIOR ART REFERENCE

Patent Reference

[Patent reference 1] Japan Patent Publication number 2008-198299

Memory cells of the NAND type flash memory includes N-type mental oxide semiconductor (MOS) structure, the N-type MOS structure includes a floating gate (charge storage layer) and a control gate. When the floating gate stores electrons, the threshold voltage of the memory cell offsets toward a positive direction, and such state may be data "0". On the other hand, when the electrons are released from the floating gate, the threshold offsets toward a negative direction, and such state may be data "1". When the blocks are all erased, all of the memory cells within the blocks may be data "1".

In such flash memory, when the programming (writing) or erasing operation is performed repeatedly, the reliability of the data may deteriorate. For example, during a programming operation, ratio of data "0" would be overwhelmingly greater as opposed to data "1", or contrast to this, ratio of data "1" would be overwhelmingly greater as opposed to data "0". Because of the miniaturization and high integration of the memory cells, distance between the memory cells is reduced, and neighboring memory cells may be capacitive coupled and interfered with each other. If memory cells surrounding a memory cell having data "1" are data "0", the memory cell at center would affect the capacity of the surrounding memory cells, and thereby the threshold value would higher as compared to all of the memory cells having data "1". Unevenness of data "0" or data "1" caused by the difference in the floating voltage of the source line voltage while reading data may also affect the characteristic of a sense amplifier.

Therefore, for reliability, an ideal ratio of the data "0" and data "1" is about 0.5. Scrambling scheme may be adapted for embodying such ratio. That is, for data to be programmed, the data is scrambled with random number, and the scrambled data is programmed to the memory array. To scramble the data, for example, addresses to be programmed may be used in seeds to change each address to random number, and thus the data "0" and data "1" may be randomly configured on the row and column directions of the memory array. In addition, during the reading operation, the scrambled data may be descrambled into original data by the random number using for the scrambling of the data read from the memory array.

In the NAND type flash memory, a memory cell is data "1" after data erasure. For example, data "FFh" is outputted for the data reading operation after erasure. Therefore, under the condition where the NAND type flash memory uses data scrambling, the descrambling must be prohibited to make the erased data are all "1". On the other hand, even though the probability is low, there is a probability that, sometimes, the data to be programmed are "1" after data scrambling. Under such condition, descrambling must be performed to read such data. Due to such limitation, in the NAND type flash memory, a flag bit is configured in a redundancy region of the memory array. The flag bit is used to determine whether a page is in erased or programmed state. The flag bit includes the block of the page being data "1" when the page is erased, and the page is changed to data "0" when the page is programmed.

FIG. 1A is a flow process for data programming operation, and FIG. 1B is a flow process for data reading operation. At first, in the programming operation, a program command is received from an external controller (S10). Then, data to be programmed and its addresses are received (S12). The received data is scrambled (S14), and then the flag bit is changed from data "1" to "0", so as to represent that the selected page are programmed (S16). Next, the scrambled data and the flag bit are programmed to the selected page (S18).

In the data reading operation, when a read command is inputted from the external controller (S20), data is read from selected page of the memory array. Next, the flag bit is evaluated (or determined) (S24). If the flag bit is "0", even if all data are "1" temporarily, since the data are programmed, the data to be read are descrambled (S26) to change the scrambled data back to the original data and output the original data (S28). On the other hands, if the flag bit is "1", the data are erased data, and therefore, the data is outputted directly without descrambling process.

Thus, there are following issues within the existing NAND type flash memory. That is, in order to embody the data scrambling scheme, storage capacity is needed for storing flag bit, the flag bit is utilized for determining whether the data is erased data or programmed data. Further, while data reading operation, additional time is spent for determining the flag bit.

SUMMARY

The disclosure is to resolve the above problems which conventional technique faces. In the disclosure, a semiconductor memory apparatus is provided, data is scrambled without identification information which is utilized to identify an erased data and data to be programmed and, at the same time, enhances the reliability.

According to an exemplary embodiment of the disclosure, the semiconductor memory apparatus includes a memory array, a retaining unit retaining data read from the memory array, or retaining data to be programmed to the memory array, an input unit inputting data, and an encoding unit. When the data from the input unit is either a first predetermined bit string or a second predetermined bit string, the encoding unit provides the data from the input unit to the retaining unit. When the data from the input unit is neither the first predetermined bit string nor the second predetermined bit string, the encoding unit scrambles the data from the input unit and provides the scrambled data to the retraining unit. Wherein, the first predetermined bit string is data when the memory array is erased, and wherein when the second predetermined bit string is scrambled by the encoding unit, the scrambled second predetermined bit string becomes the first predetermined bit string.

According to an exemplary embodiment of the disclosure, the semiconductor memory apparatus further includes an output unit outputting data and a decoding unit. When the data from the retaining unit is either the first predetermined bit string or the second predetermined bit string, the decoding unit provides the data from the retaining unit to the output unit. When the data from the retaining unit is neither the first predetermined bit string nor the second predetermined bit string, the decoding unit descrambles the data from the retaining unit and provides the descrambled data to the output unit. According to an exemplary embodiment of the disclosure, the encoding unit includes a first detector receiving the data from the input unit and detecting whether the data from the input unit includes the first predetermined bit string, a scrambling circuit receiving the data from the input unit and scrambling the data from the input unit, a second detector receiving the scrambled data from the scrambling circuit and detecting whether the scrambled data includes the second predetermined bit string, and a first selection unit selecting the data from the input unit or the scrambled data from the scrambling circuit based on the detection result of the first detector and the second detector. According to an exemplary embodiment of the disclosure, the decoding unit includes a third detector receiving the data from the retaining unit and detecting whether the data form the retaining unit includes the first predetermined bit string, a descrambling circuit receiving the data from the retaining unit and descrambling the data from the retaining unit, a fourth detector receiving the descrambled data from the descrambling circuit and detecting whether the descrambled data includes the second predetermined bit string, and a second selection unit selecting the data from the retaining unit or the descrambled data from the descrambling circuit based on the detection results of the third detector and the fourth detector. For example, the first predetermined bit string includes bit string of logic 1.

The disclosure provides a data processing method for a semiconductor memory apparatus having NAND memory array. According to an exemplary embodiment of the disclosure, the data processing method includes a data inputting step inputting external data to be programmed and an encoding step. In the encoding step, when the input data is either a first predetermined bit string or a second predetermined bit string, the input data is provided to the memory array. When the input data is neither the first predetermined bit string nor the second predetermined bit string, the input data scrambled and the scrambled data is provided to the memory array. Wherein, the first predetermined bit string is data when the memory array is erased, and wherein when the second predetermined bit string is scrambled, the scrambled second predetermined bit string becomes the first predetermined bit string.

According to an exemplary embodiment of the disclosure, the data processing method further includes a data reading step reading data from the memory array and a decoding step. In the decoding step, when the read data is either the first predetermined bit string or the second predetermined bit string, the read data is provided to an output unit. When the read data is neither the first predetermined bit string nor the second predetermined bit string, the read data is descrambled and the descrambled data is provided to the output unit. According to an exemplary embodiment of the disclosure, the encoding step includes a first detecting step detecting whether the input data comprises the first predetermined bit string, a scrambling step scrambling the input data, a second detecting step detecting whether the scrambled data includes the second predetermined bit string, and a first selection step selecting the input data or the scrambled data based on the detection result of the first detecting step and the second detecting step. According to an exemplary embodiment of the disclosure, the decoding step includes a third detecting step detecting whether the read data from the memory array includes the first predetermined bit string, a descrambling step descrambling the read data, a fourth detecting step detecting whether the descrambled data includes the second predetermined bit string, and a second selection step selecting the read data or the descrambled data based on the detection result of the third detecting step and the fourth detecting step. For example, the first predetermined bit string includes bit string of logic 1.

According to the disclosure, in a case where input data is equivalent to either the first predetermined bit string corresponding to the memory array after erasure or the second predetermined bit string which becomes the first predetermined bit string when scrambled, the input data is programmed to the memory array without scrambling. In a case where read data read from the memory array is equivalent to either the first predetermined bit string or the second predetermined bit string, the read data is outputted without descrambling. Based on the above, the disclosure does not require flag bit or other identification information, where the flag bit is utilized to identify an erased data and a programmed data. Therefore, the storage capacity of the memory array may be effectively utilized for other resources, and it is possible to reduce data read time when the data is scrambled.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1A is a process flow for data programming operation. FIG. 1B is a process flow for data reading operation.

FIG. 3 is a circuit diagram illustrating structure of NAND string of memory cells array according to an exemplary embodiment of the disclosure.

FIG. 4 is a diagram illustrating voltages applied to each part of the flash memory while programming operation according to an exemplary embodiment of the disclosure.

FIG. 5 is a diagram illustrating an internal structure of a scrambling unit according to an exemplary embodiment of the disclosure.

FIG. 6A is a table representing the basis for a writing encoder to perform scrambling operation. FIG. 6B is a table representing the basis for a reading decoder to perform descrambling operation.

DETAILED DESCRIPTION OF DISCLOSED EMBODIMENTS

Figure 1B:
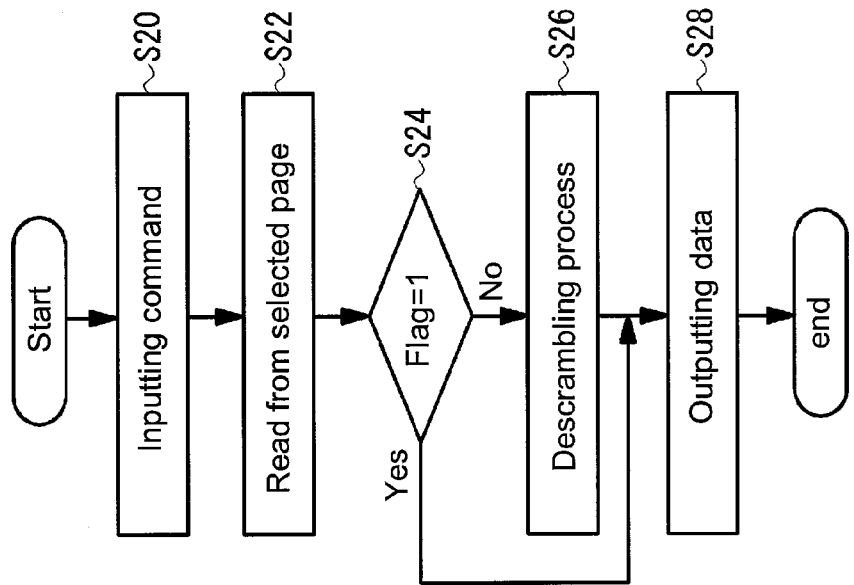
FIGS. 1A-1B are process flow diagrams illustrating a data scrambling of a NAND type flash memory.
Figure 1A:
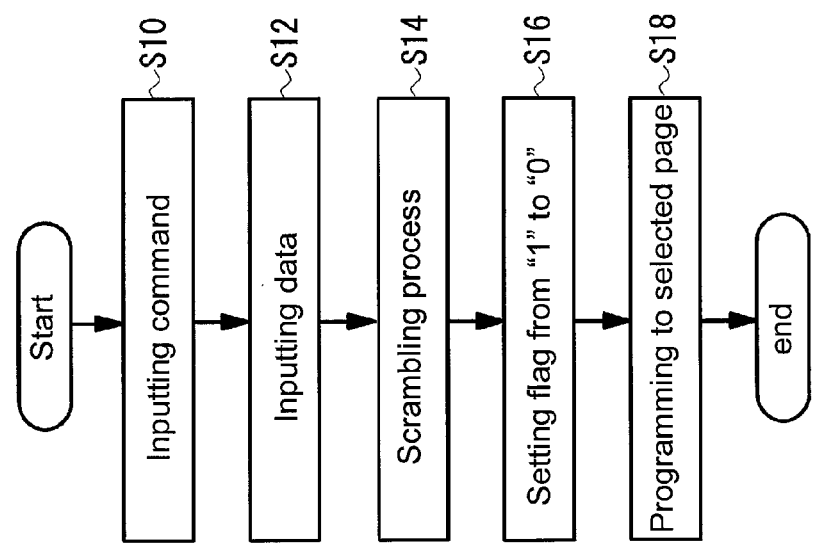

Reference will now be made in detail to the present preferred embodiments of the invention, examples of which are illustrated in the accompanying drawings. Wherever possible, the same reference numbers are used in the drawings and the description to refer to the same or like parts.

Figure 2:
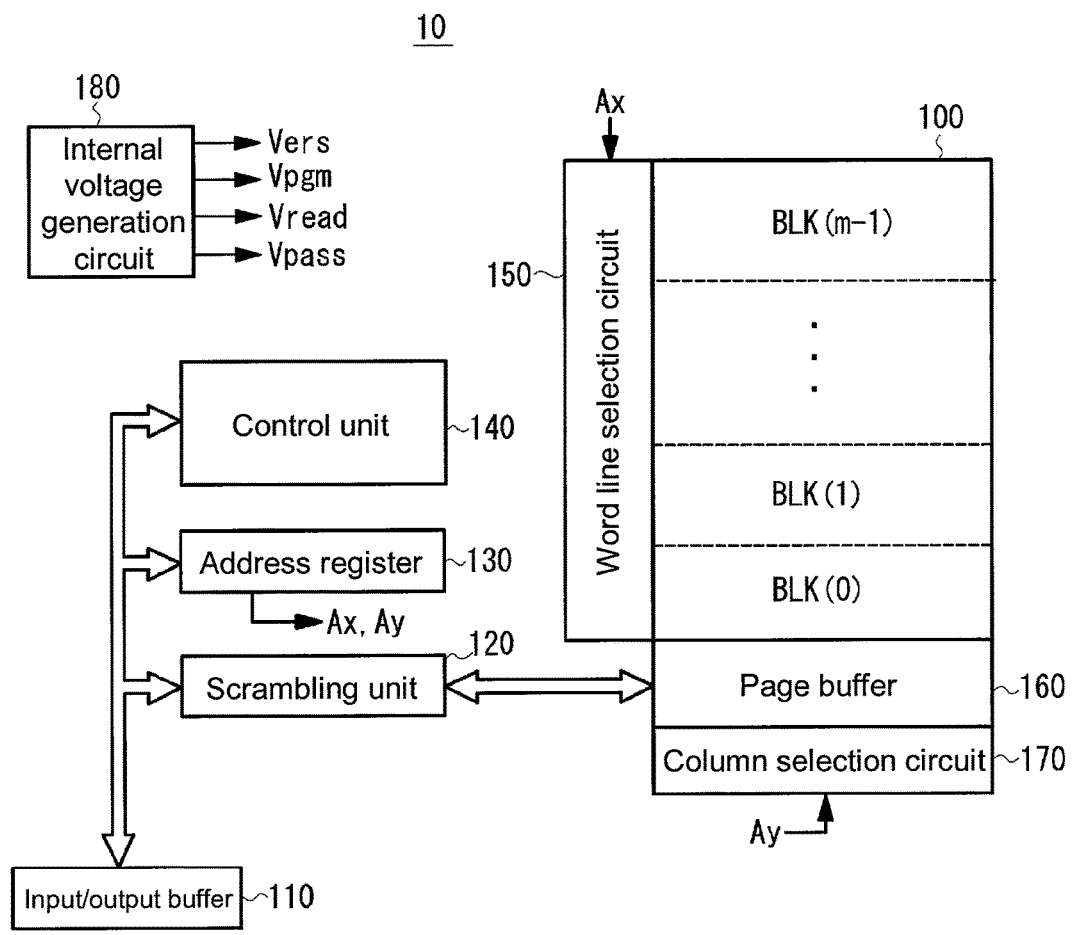
FIG. 2 is a diagram illustrating an overall structure of a NAND type flash memory according to an exemplary embodiment of the disclosure.

FIG. 2 is diagram illustrating a typical structure of a flash memory according to an exemplary embodiment of the disclosure. However, the illustrated structure of the flash memory is only utilized as an example, and the disclosure is not limited thereto. The flash memory 10 of the exemplary embodiment includes a memory array 100, an input/output buffer 110, a scrambling unit 120, an address register 130, a control unit 140, a word line selection circuit 150, a page buffer 160, a column selection circuit 170, and an internal voltage generation circuit 180. The memory array 100 has a plurality of memory cells arranged in matrix. The input/output buffer 110 is connected to external input/output terminal I/O and retains input and output data. The scrambling unit 120 is configured to scramble data to be programmed to the memory array 100 and descramble data read from the memory array 100. The address register 130 receives address data from the input/output buffer 110. The control unit 140 receives command data from the input/output buffer 110 or an external control signal, so as to control each portion. The word line selection circuit 150 receives row address information Ax from the address register 130 and decodes the row address information Ax. Based on the decoded result, block, word line, etc. are selected. The page buffer 160 retains data read from the page selected by the word line selection circuit 150 or retains data to be programmed to the selected pages. The column selection circuit 170 receives column address information Ay from the address register 130 and decode the column address information Ay. Based on the decoded result, data in the page buffer 160 are selected. In addition, the internal voltage generation circuit 180 generates various voltages (a writing voltage Vpgm, a pass voltage Vpass, readout voltage Vread, an erasing voltage Vers, etc.) needed for data reading (readout), programming and erasing operations.

The memory array 100 includes m memory blocks BLK (0), BLK(1) ... BLK(m−1) configured in a column direction. The page buffer 160 is disposed near the block BLK(0). In addition to such configuration, the page buffer 160 may be disposed at other end of the block or both ends of the block.

In one memory block, as illustrated in FIG. 3, there is a plurality of NAND serial units NU, the NAND serial units NU are formed by serially connecting a plurality of memory cells. In the memory block, there are n+1 NAND serial units (NU) arranged along a row direction. The NAND serial unit NU includes a plurality of memory cells MCi (where i=0, 1 ... 31) that are serially connected together, a selection transistor TD connected to a drain terminal of the memory cell MC31 at one end of the NAND serial unit NU, and a selection transistor TS connected to a source terminal of the memory cell MC0 at the other end of the NAND serial unit NU. A drain terminal of the selection transistor TD is connected to a bit line GBL (e.g., GBL0-GBLn), and source terminal of the selection transistor TS is connected to a common source line SL.

The control gates of the memory cells MCi are connected to the word lines WLi. The gate terminal of the selection transistors TD and TS are connected to selection gate lines SGD and SGS that are parallel with the word lines WLi. When the word line selection circuit 150 selects a block based on the row address Ax or converted address, the selecting transistors TD and TS are selectively driven based on the selection gate lines SGS and SGD of the block. FIG. 3 depicts structure of a typical memory cell unit, however, the memory cell unit may include one or more dummy cells in the NAND string.

The memory cell typically has a MOS structure. The MOS structure includes source/drain acting as a n-type diffusion region and formed in a p well, a tunnel oxide layer forming a channel between the source/drain, a floating gate (charge storage layer) formed on the top of the tunnel oxide layer, and a control gate formed on the top of the floating gate by a dielectric film. When the floating gate does not store charges, i.e., data "1" is written, threshold value may be in a negative state, and the memory cell is normally on. When the floating gate stores charges, i.e., data "0" is written, the threshold value offsets to positive state, and the memory cell is normally off. The memory cell may be a single level cell (SLC) storing 2 bit of data, or a multi level cell (MLC) storing a plurality bits.

FIG. 4 is a table illustrating bias voltages to be applied for various operations of the flash memory according to an exemplary embodiment of the disclosure. For data readout operation, a positive voltage is applied to the bit line and certain voltage (e.g., 0V) is applied to the selected word line. The passing voltage Vpass (e.g., 4.5V) is applied to the non-selected word line, and positive voltage (e.g., 4.5V) is applied to the selection gate lines SGD and SGS to turn on the bit line selection transistors TD and the source line selection transistor TS. In addition, 0V is applied to the common source line SL. For data programming (writing) operation, a programming voltage Vpgm (e.g., 15V-20V) is applied to the selected word line, and an intermediate voltage level (e.g., 10V) is applied to the non-selected word line, so as to turn on the bit line selection transistor TD and turn off the source line selection transistor TS. In addition, the voltage level corresponding to data "0" or "1" is supplied to the bit line GBL. For erasure operation, 0V is applied to the selected word line in the block, and high voltage (e.g., 20V) is applied to the p well, so as to extract the charges stored in the floating gate to the substrate. As a result, data are erased in a unit of block.

In the following, data scrambling process of the exemplary embodiment is described in detail. As illustrated in FIG. 5, the scrambling unit 120 is disposed between the input/output buffer 110 and the page buffer 160. In the programming operation, a writing encoder 200 scrambles data inputted from the input/output buffer 110, and then provides the scrambled data to the page buffer 160. In the readout operation, a reading decoder 220 descrambles data read from the page buffer 160 and provides the descrambled data to the input/output buffer 110. Usually, the scrambling process performs an exclusive-or (XOR) logic operation to an input data and a random number seed generated according to the addresses. At this time, the XOR logic operation is again performed to the scrambled data with the same random number seed, so as to obtain the input data that was originally inputted, i.e., descrambled data. Therefore, the writing encoder 200 performing the scrambling process and the reading decoder 220 performing the descrambling process may include similar circuit, so as to respectively perform descrambling and scrambling processes.

In the NAND flash memory, in a state of performing a scrambling of data, data "1" must be outputted in the readout after erasure. Therefore, when the erased data is read, scrambling of data is prohibited. On the other hand, when the programming operation is performed to the scrambled data having all "1", which is data different from the erased data read after erasure that retained in the memory cell array in a scrambled state, descrambling must be performed for readout operation. Therefore, the data must be discriminate from the erased data read after erasure. Conventionally, the flag bit is provided to discriminate these two types of data. However, in the exemplary embodiment, the flag bit is not utilized. Instead, the scrambling process is controlled based on the structure of the data to be programmed or the readout data.

The writing encoder 200 scrambles the data to be programmed inputted from the input/output buffer 110. The reading decoder 220 descrambles the readout data retained by the page buffer 160. FIG. 6A is a table representing the basis of the writing encoder 200 for scrambling according to an exemplary embodiment of the disclosure. At first, when input data from the input/output buffer 110 are "1" (also referred to as FFh for convenience), scrambling of the input data "FFh" is not performed, and then the input data "FFh" is directly programmed to the memory array. Under a condition where the input data is "XXh", scrambling of the input data "XXh" is not performed, and the input data "XXh" is directly programmed to the memory array. Here, the "XXh" becomes data of "FFh" after scrambled. When the input data is neither "FFh" nor "XXh" (referred to "YYh" for convenient), the input data "YYh" is scrambled, then the scrambled data "ZZh" is programmed to the memory array.

FIG. 6B is the basis of the reading decoder 220 for descrambling process according to an exemplary embodiment of the disclosure. When the readout data that is read from the page buffer 160 is "FFh", the descrambling of the data "FFh" is not performed, and then the data "FFh" is directly output to the input/output buffer 110. Under a condition where the readout data is "XXh", the descrambling of the readout data "XXh" is not performed, and then the readout data "XXh" is directly output to the input/output buffer 110. When the readout data is "ZZh", the readout data "ZZh" is descrambled, and the descrambled data "YYh" is then outputted to the input/output buffer 110.

Figure 7A:
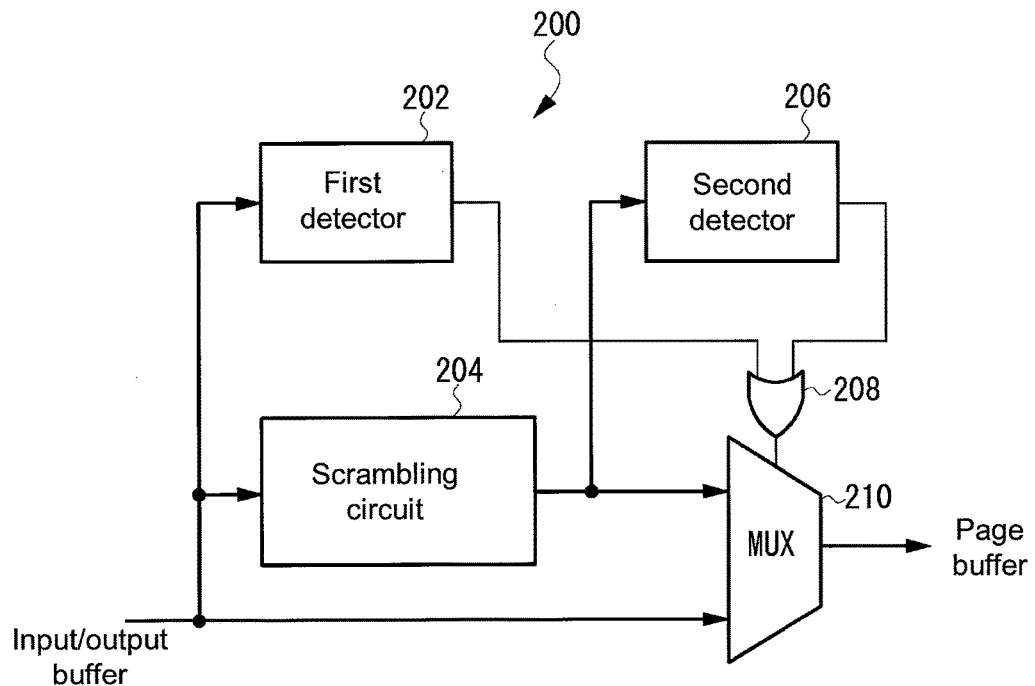
FIG. 7A is block diagram illustrating an internal structure of a writing encoder according to an exemplary embodiment of the disclosure.
Figure 7B:
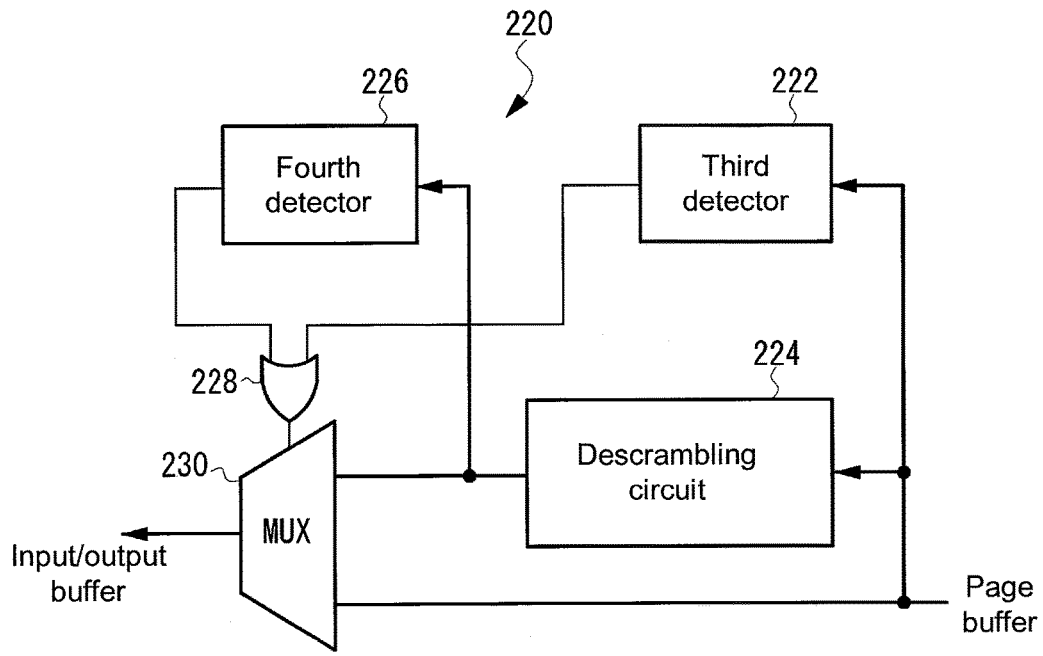
FIG. 7B is a block diagram illustrating an internal structure of a reading decoder according to an exemplary embodiment of the disclosure.

FIG. 7A is a block diagram illustrating the structure of a writing encoder 200 according to an exemplary embodiment of the disclosure. FIG. 7B is a block diagram illustrating the structure of a reading decoder 220 according to an exemplary embodiment of the disclosure. The writing encoder 200 includes a first detector 202, a scrambling circuit 204, a second detector 206, an OR circuit 208, and a multiplexer 210. The first detector 202 receives an input data and detects whether the input data is equivalent to "FFh". The scrambling circuit 204 receives the input data and scrambles the input data. The second detector 206 receives the scrambled data outputted from the scrambling circuit 204 and detects whether the scrambled data is equivalent to "FFh". The OR circuit 208 receives the detection results from the first detector 202 and the second detector 206 and outputs according to its OR logic. In addition, the multiplexer 210 receives the input data from the input/output buffer 110 and the scrambled data from the scrambling circuit 204 and selects one of them to output based on the OR circuit 208. When the output of the OR circuit 208 is H level, i.e., when either the first detector 202 or the second detector 206 is detected to be "FFh", the multiplexer 210 selects the input data from the input/output buffer 110 to output to the page buffer 160. When the output of the OR circuit 208 is L level, the multiplexer 210 selects the scrambled data from the scrambling circuit 204 to output to the page buffer 160.

The reading decoder 220 performs similar processes as the writing encoder 200. The reading decoder 220 includes a third detector 222, a descrambling circuit 224, a fourth detector 226, an OR circuit 228, and a multiplexer 230. The third detector 222 receives readout data from the page buffer 160 and detects whether the readout data is equivalent to "FFh". The descrambling circuit 224 receives the readout data and descrambles the readout data. The fourth detector 226 receives the descrambled data output from the descrambling circuit 224 and detects whether the descrambled data is equivalent to "FFh". The OR circuit 228 receives the detection results from the third detector 222 and the fourth detector 226 and outputs according to its OR logic. In addition, the multiplexer 230 receives the readout data from the page buffer 160 and the descrambled data from the descrambling circuit 224 and selects one of them to output based on the output of the OR circuit 228. When the output of the OR circuit 228 is H level, i.e., when either the third detector 222 or the fourth detector 226 detects that the readout data is "FFh", the multiplexer 230 selects the readout data to output to the input/output buffer 110. When the output of the OR circuit 228 is L level, the multiplexer 230 selects the descrambled data from the descrambling circuit 224 to output to the input/output buffer 110.

In the exemplary embodiment, when the data to be programmed is "FFh", the data "FFh" is programmed to the memory array without been scrambled. The data "FFh" that is to be programmed is the similar to the erased data in the memory array, and when the readout data is "FFh", the data "FFh" is directly output. Therefore, the reading of the data "FFh" to be programmed and the erased data does not cause issue.

When data to be programmed is "XXh", the data "XXh" is programmed to the memory array without been scrambled. That is, in the memory array, the data similar with the erased data in data structure is not programmed, and therefore, it may be distinguished as the erased data. For example, when a certain block is erased, the memory cells of each page in the block are data "1". When the data "XXh" is programmed to a selected page in the erased block, the data "XXh" is directly programmed to the selected page. If the data "XXh" is scrambled, the data "XXh" would be programmed as "FFh". Such data "XXh" after scrambled would not be distinguishable from the programming data of data "FFh".

Thus, in the exemplary embodiment, when the data is "FFh" and "XXh" scrambling process may be skipped. Therefore, it is not necessary to write flag bit for each of the pages and determine the flag bit during data readout, which are performed conventionally. Thus, the storage capacity of the memory array may be effectively utilized for other resources and the data readout rate is also enhanced. In addition, in the exemplary embodiment, the data "FFh" and "XXh" are not scrambled, however, the probability of the occurrence of these data is low, and there is a limited impact on the overall reliability.

Next, other exemplary embodiments of the disclosure are described below. In the NAND type flash memory, consecutive data programming may be executed to a page for n times (where n is a natural number above 2), which is referred to as a partial page program hereafter for the convenience of description. If the integration of the memory cells is further dense, the capacity of one page also increases. The capacity of the data to be programmed may not be enough to fill the capacity of one page sometimes. If a page may only be programmed with data once, the capacity of each page is not efficiently utilized. From another aspect, if there is a plurality of data that is to be programmed to one page, these data must be programmed to a plurality of pages, which substantially increases the amount of time needed for programming. On the other hand, when one page is being programmed consecutively for n times, which means that high programming voltage is being applied to the page for n times, the number of times for the page to be consecutively programmed may be limited. For example, if n=4, the page may be consecutively programmed with data for 4 times.

The partial page program is, for example, after a programming command is received from an external controller, row address Ax and column address Ay1 are received. Next, partial data D1 is received, so as to program the partial data D1 from the column address Ay1 which is selected by the row address Ax. Then, column address Ay2 and partial data D2 are received to program the partial data D2 from the page of the column address Ay2. The above process is performed repeatedly for n times, which results in programming the partial data D1, D2 . . . Dn to one page.

In the NAND type flash memory that may perform the above partial page program, when data scrambling scheme is utilized, it must be identified whether the partial data in the page is either programmed data or erased data. The size of the partial data programmed through partial page program is not fixed and may vary. Thus, data descrambling would not be properly performed if the range of the partial data is not identified.

When the scrambling unit 120 of the exemplary embodiment is utilized, partial data may be properly scrambled without identifying the range of the partial data even in the case of partial page program.

The exemplary embodiment illustrated an example where the scrambling unit 120 is disposed between the input/output buffer 110 and the page buffer 160. However, the disclosure is not limited thereto, for example, the scrambling unit 120 may be disposed in the page buffer 160.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A semiconductor memory apparatus, comprising:
 a memory array;
 a retaining unit, retaining data read from the memory array, or retaining data to be programmed to the memory array;
 an input unit, inputting data; and
 an encoding unit, when the data from the input unit is either a first predetermined bit string or a second predetermined bit string, providing the data from the input unit to the retaining unit, and when the data from the input unit is neither the first predetermined bit string nor the second predetermined bit string, scrambling the data from the input unit and providing the scrambled data to the retaining unit, wherein the first predetermined bit string is data when the memory array is erased, and wherein when the second predetermined bit string is scrambled by the encoding unit, the scrambled second predetermined bit string becomes the first predetermined bit string.

2. The semiconductor memory apparatus as claimed in claim 1, wherein the encoding unit comprises:
 a first detector, receiving the data from the input unit, detecting whether the data from the input unit comprises the first predetermined bit string;
 a scrambling circuit, receiving the data from the input unit and scrambling the data from the input unit;
 a second detector, receiving the scrambled data from the scrambling circuit and detecting whether the scrambled data comprises the second predetermined bit string; and
 a first selection unit, selecting the data from the input unit or the scrambled data from the scrambling circuit based on the detection result of the first detector and the second detector.

3. The semiconductor memory apparatus as claimed in claim 1, further comprising:
 an output unit, outputting data; and
 a decoding unit, when the data from the retaining unit is either the first predetermined bit string or the second predetermined bit string, providing the data from the retaining unit to the output unit, when the data from the retaining unit is neither the first predetermined bit string nor the second predetermined bit string, descrambling the data from the retaining unit and providing the descrambled data to the output unit.

4. The semiconductor memory apparatus as claimed in claim 3, wherein the decoding unit comprises:
 a third detector, receiving the data from the retaining unit, detecting whether the data form the retaining unit comprises the first predetermined bit string;
 a descrambling circuit, receiving the data from the retaining unit and descrambling the data from the retaining unit;
 a fourth detector, receiving the descrambled data from the descrambling circuit, detecting whether the descrambled data comprises the second predetermined bit string; and
 a second selection unit, selecting the data from the retaining unit or the descrambled data from the descrambling circuit based on the detection results of the third detector and the fourth detector.

5. The semiconductor memory apparatus as claimed in claim 1, wherein the first predetermined bit string comprises bit string of logic 1.

6. A data processing method, for a semiconductor memory apparatus having NAND type memory array, the data processing method comprising:
 a data inputting step, inputting external data to be programmed; and
 an encoding step, when the input data is either a first predetermined bit string or a second predetermined bit string, providing the input data to the memory array, and when the input data is neither the first predetermined bit string nor the second predetermined bit string, scrambling the input data and providing the scrambled data to the memory array, wherein the first predetermined bit string is data when the memory array is erased, and wherein when the second predetermined bit string is scrambled, the scrambled second predetermined bit string becomes the first predetermined bit string.

7. The data processing method as claimed in claim 6, wherein the encoding step comprises:
- a first detecting step, detecting whether the input data comprises the first predetermined bit string;
- a scrambling step, scrambling the input data;
- a second detecting step, detecting whether the scrambled data comprises the second predetermined bit string; and
- a first selection step, selecting the input data or the scrambled data based on the detection result of the first detecting step and the second detecting step.

8. The data processing method as claimed in claim 6, further comprising:
- a data reading step, reading data from the memory array; and
- a decoding step, when the read data is either the first predetermined bit string or the second predetermined bit string, providing the read data to an output unit, and when the read data is neither the first predetermined bit string nor the second predetermined bit string, descrambling the read data and providing the descrambled data to the output unit.

9. The data processing method as claimed in claim 8, wherein the decoding step comprises:
- a third detecting step, detecting whether the read data from the memory array comprises the first predetermined bit string;
- a descrambling step, descrambling the read data;
- a fourth detecting step, detecting whether the descrambled data comprises the second predetermined bit string; and
- a second selection step, selecting the read data or the descrambled data based on the detection result of the third detecting step and the fourth detecting step.

10. The data processing method as claimed in claim 6, wherein the first predetermined bit string comprises bit string of logic 1.

* * * * *